(12) United States Patent
Kim et al.

(10) Patent No.: US 6,877,998 B1
(45) Date of Patent: Apr. 12, 2005

(54) POWER AND GROUND CONNECTORS FOR SOCKET

(75) Inventors: Hyunjun Kim, Chandler, AZ (US); Jianggi He, Gilbert, AZ (US); Dong-Ho Han, Phoenix, AZ (US); Joong-Ho Kim, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/728,463

(22) Filed: Dec. 5, 2003

(51) Int. Cl.[7] .......................... H01R 4/66; H01R 13/648
(52) U.S. Cl. ..................................... 439/108; 439/862
(58) Field of Search .............................. 439/108, 862, 439/71

(56) References Cited

U.S. PATENT DOCUMENTS

| | | | | |
|---|---|---|---|---|
| 4,597,029 A | * | 6/1986 | Kucharek et al. | 361/775 |
| 6,695,624 B1 | * | 2/2004 | Szu | 439/66 |

* cited by examiner

*Primary Examiner*—Hae Moon Hyeon
(74) *Attorney, Agent, or Firm*—Schwabe, Williamson & Wyatt, P.C.

(57) ABSTRACT

A socket electrically connects an integrated circuit package and a circuit board. The socket includes a frames having a plurality of electrical connectors mounted to the frame. The plurality of electrical connectors includes at least one pair of power and ground connectors, with power connector including a first broadside portion and the ground connector including a second broadside portion. The first and second broadside portion are disposed in an adjacent, spaced-apart, and substantially parallel relationship.

15 Claims, 2 Drawing Sheets

POWER AND GROUND CONNECTORS FOR SOCKET

BACKGROUND OF THE INVENTION

1. Field of the Invention

The present invention relates electrical interconnects, and in particular, to sockets.

2. Description of Related Art

Land grid array (LGA) sockets, comprising an array of connectors, are commonly used to connect an integrated circuit (IC) package to a printed circuit board (PCB). Surface mounted sockets have the connectors soldered to the PCB. Sockets typically have a plurality of pairs of power and ground connectors. In recent years, the clock speed of IC package has increased significantly.

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
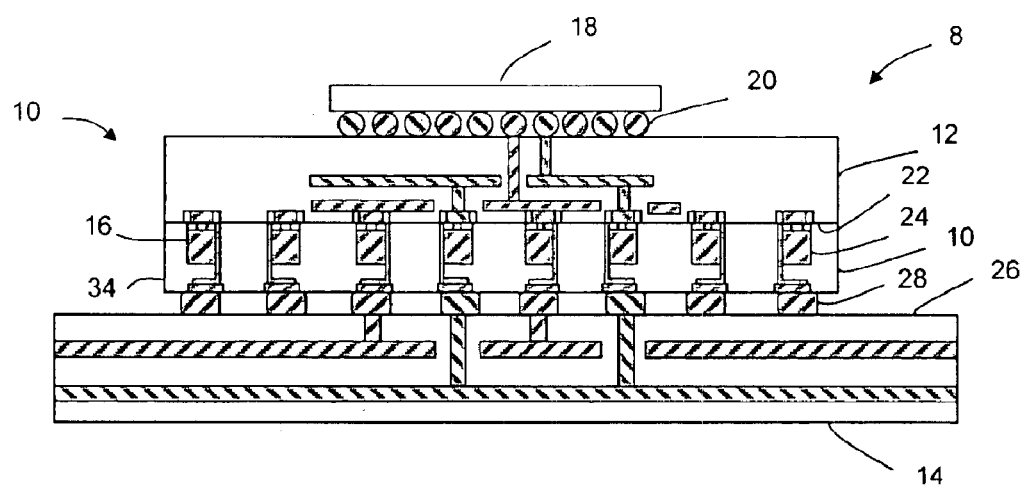
FIG. 1 is a generalized diagram of an electronic assembly having a socket in accordance with one embodiment of the present invention.

FIG. 1 is an illustrative diagram of an electronic assembly 8 which includes a land grid array (LGA) socket 10, an integrated circuit (IC) package 12 and a printed circuit board (PCB) 14, in accordance with one embodiment. The LGA socket 10 provides electrical interconnects between the IC package 12 and the PCB 14 by way of an array of connectors 16. An IC 18 is electrically and mechanically connected to the IC package 12, using, e.g., wire-bond (not shown) or solder connections 20. The IC package 12 may have on its bottom 22 a plurality of electrical contacts in the form of conductive land pads 24. Signals, power, and ground typically are routed to and from the IC package 12 through the land pads 24, which mate with complementary connectors 16 mounted in a frame 34 of the LGA socket 10. The LGA socket 10 may be a surface mounted socket; hence, I/O signals, power, and ground may be routed through the array of connectors 16 from the PCB 14 to the socket 10 via soldered connections on the a top surface 26 of the PCB 14, as illustrated in FIG. 1 by a plurality of solder balls 28.

The PCB 14 acts as a vehicle to supply the power, ground, and I/O signals to IC 18. The power, ground, and other signals are supplied through traces or planes on or within IC 18, IC package 12 and PCB 14 (a few illustrative planes are shown in FIG. 1). Often, a large number of the sockets connectors 16 are dedicated to power and ground. For example, in one illustrative application for the LGA socket 10, there is an array of 775 connectors 16, with the connectors 16 including about 225 power and ground pairs (dedicated to current supply and return) and about 260 connectors 16 for I/O signals. For illustration purposes in FIG. 1, only 4 power and ground pairs are shown.

Figure 2:
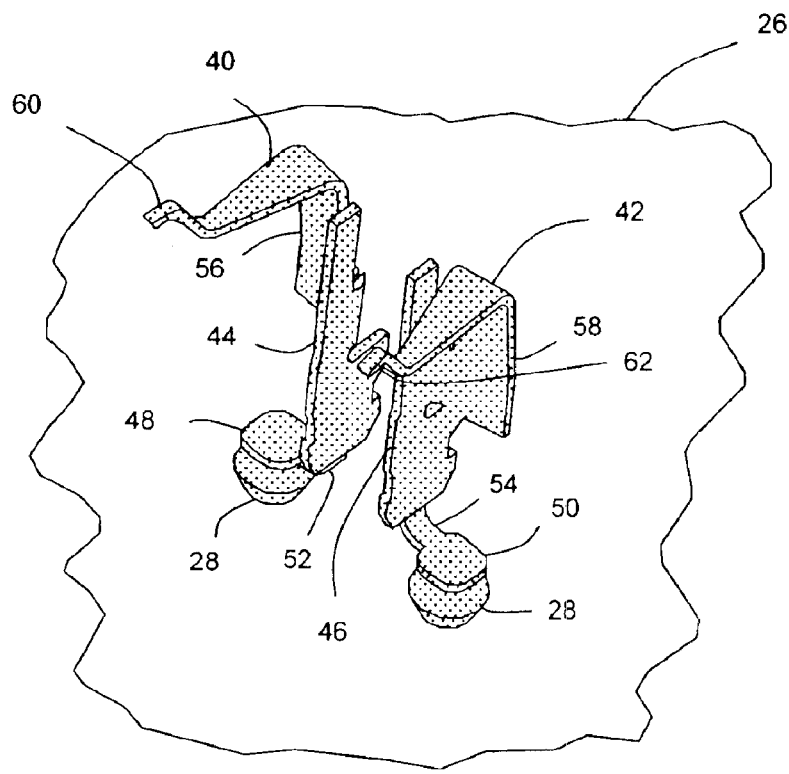
FIG. 2 is a perspective view of a pair of power and ground connectors positioned in the socket shown in FIG. 1 with the frame of the socket removed.

FIG. 2 illustrates one of the pair of power and ground connectors for the socket 10 of FIG. 1, with the power connector being designated by the reference numeral 40 and the ground connector being designated by the reference numeral 42, in accordance with one embodiment. The power and ground connectors 40 and 42 may be positioned and orientated with respect to each other in the socket as they appear in FIG. 2, with the connectors 40 and 42 being mirror images of each other with respect to a bisecting, vertical geometric plane disposed between the two connectors 40 and 42.

The connectors 40 and 42 may have adjacent planar broadside portions 44 and 46, respectively, which may be used to secure the connectors 40 and 42 to the frame (not shown) of the socket. The broadside portions 44 and 46 face each other in an adjacent, spaced-apart and substantially parallel relationship. The mounted broadside portions 44 and 46 traverse the width of the socket and are disposed in parallel spaced-apart planes which are substantially perpendicular to the top surface 26 of the PCB and the bottom surface of the IC package (not shown). A pair of soldering contacts 48 and 50 may be positioned laterally outward relative to the geometric planes of their respective broadside portions 44 and 46 in opposite directions via outwardly-extending arcuate arm portions 52 and 54. The soldering contacts 48 and 50 may have co-planar, downwardly facing, plate-like surfaces for engaging the solder. The soldering contacts 48 and 50 may be integrally formed on the outer ends of the arcuate arm portions 52 and 54, respectively, which may be integrally attached at the bottoms of the broadside portions 44 and 46, respectively. A pair of solder balls 28 illustrates that the bottom sides of the soldering contacts 48 and 50 may be electrically connected to the top surface 26 of the PCB. A pair of L-shaped bracket portions 56 and 58 may extend laterally in opposite directions from the broadside portions 44 and 46, respectively. A pair of upwardly biased, mating contacts 60 and 62 may be integrally formed at the ends of the bracket portions 56 and 58, respectively. The mating contacts 60 and 62 may be disposed for steady engagement of a pair of land pads (not shown) on the bottom of the IC package (see FIG. 1). In other words, the bracket portions 56 and 58 may be employed to provide upward resilient force (an upward bias) to assure stable electrical connections between the mating contacts 60 and 62 and the land pads of the IC package.

Referring to FIGS. 1 and 2, the configuration and alignment of the power and ground connectors 40 and 42 are likely to provide better electrical performance, such as common mode noise reduction, to enhance signal integrity performance. The power and ground socket connectors 40 and 42 may be configured and oriented to obtain symmetry about the imaginary geometric plane bisecting the distance between the connectors 40 and 42, such plane being substantially perpendicular to the top surface 26 of the PCB 14 and the bottom surface 22 of the IC package 12. Hence, the broadside portion 44 and 46 are substantially parallel to the geometric plane. Because the areas of the broadside portions 44 and 46 of the connectors 40 and 42, respectively, are facing each other in a spaced-apart adjacent relationship and are in relatively close proximity, enhanced noise reduction may be obtained without additional structures or manufacturing processes. The distance between the broadside portions 44 and 46 may be less than a 1 millimeter and the distance from center-to-center of the two solder balls 28 in FIG. 2 may be about 1 to 1.2 millimeters. By having the two arcuate arm portions 52 and 54 extend outwardly from the geometric plane in opposite directions and the two bracket portions 56 and 58 extending outwardly from the geometric plane in opposite directions, such directions being substantially perpendicular to the geometric plane, the distance between the two broadside portions 44 and 46 may be reduced. The bottom surface 22 of the IC package 12 may be disposed in a spaced-apart, substantially parallel relationship to the top surface 26 of the PCB 14; hence, both surfaces may be substantially perpendicular to the geometric plane bisecting the power and ground connectors 40 and 42. In summary, the socket 10, in accordance to one embodiment of the present invention shown in FIGS. 1 and 2, may provide the following technical advantages. The symmetrical pairs of power and ground connectors 40 and 42 result in reduced common mode noise. The symmetrical connector pairs have closer opposed broadside portions 44 and 46 and, as a result, reduced socket pin loop inductance may be achieved.

In one illustrative system including one embodiment of the electronic assembly 8, the IC 18 may be a processor. The term "processor" may mean any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit. Other types of IC circuits 18 that may be included in electronic assembly 8 are a custom circuit, an application-specific integrated circuit (ASIC), or the like, such as, for example, one or more circuits for use in wireless devices like cellular telephones, pagers, portable computers, two-way radios, and similar electronic systems. Electronic assembly 8 may perform any other type of function. The LGA socket 10 many be used in multiple locations within the system 70.

In various embodiments, the system 70 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Figure 3:
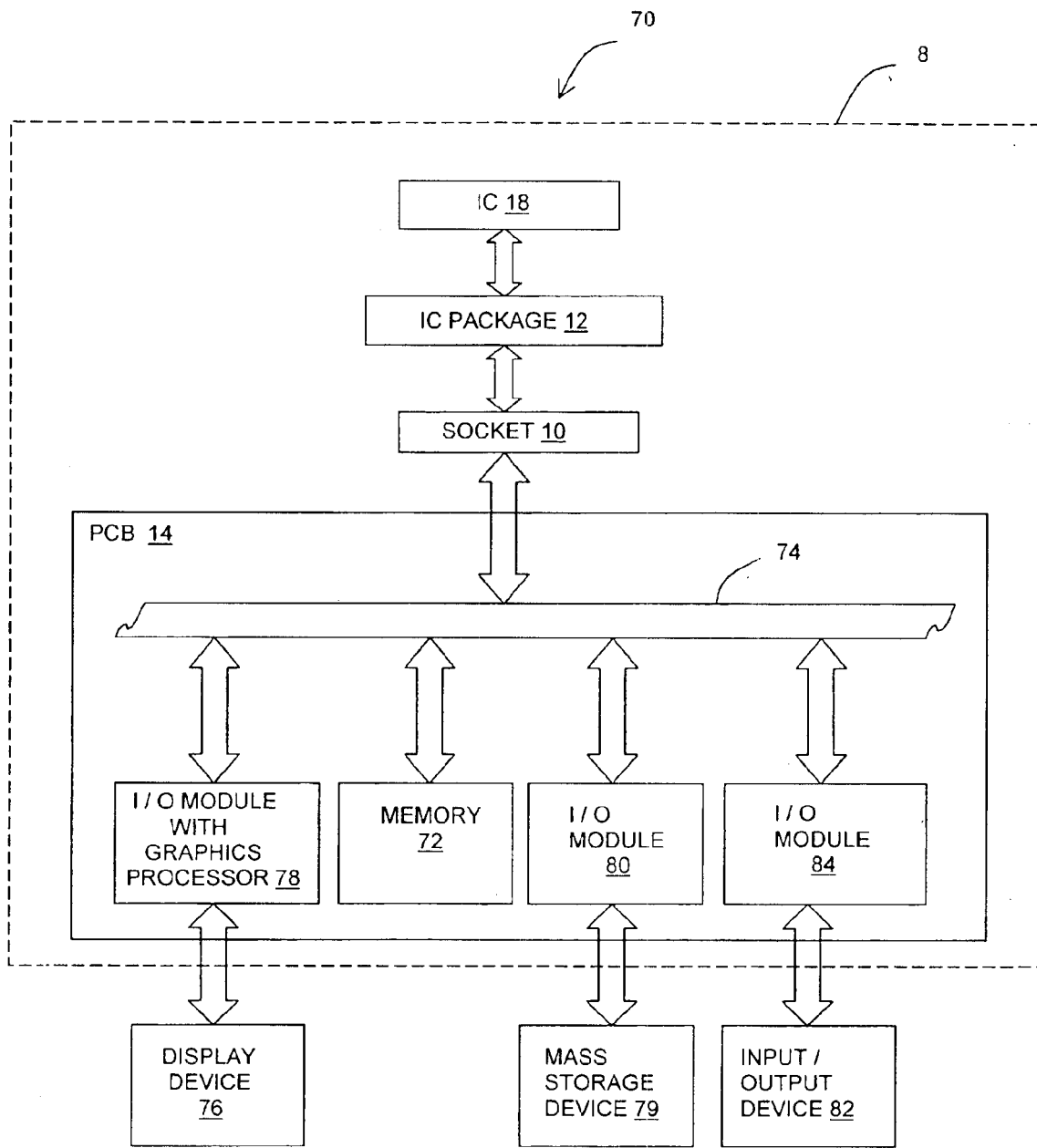
FIG. 3 is a block diagram of a system incorporating the electronic assembly of FIG. 1.

Referring to FIG. 3, there is illustrated one of many possible systems 70 in which the electronic assembly 8 may be used. In this illustrative system, the IC 18, which is mounted in the IC package 12, may be a microprocessor and PCB 14 may be a motherboard, with the LGA socket 10 interconnecting the IC package 12 and the PCB 14. In addition to the LGA socket 10 and the IC package 12, the motherboard PCB 14 may have mounted thereon a main memory 72 and a plurality of input/output (I/O) modules for external devices or external buses, all coupled to each other by a bus system 74 on the motherboard PCB 14. More specifically, the system 70 may include a display device 76 coupled to the bus 74 by way of an I/O module 78, with the I/O module 78 having a graphical processor and a memory. The I/O module 78 may be on the PCB 14 as shown in FIG. 3 or on a separate expansion board. The system 70 may further include a mass storage device 79 coupled to the bus 74 via an I/O module 80. Another I/O device 82 may be coupled to the bus 74 via the I/O module 84. Additional I/O modules may be included for other external or peripheral devices or external buses. Examples of the memory 72 include, but are not limited to, static random access memory (SRAM) and dynamic random access memory (DRAM). The memory 72 may include an additional cache memory. Examples of the mass storage device 79 include, but are not limited to, a hard disk drive, a compact disk drive (CD), a digital versatile disk driver (DVD), a floppy diskette, a tape system and so forth. Examples of the input/output devices 80 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 14. Examples of the bus system 74 include, but are not limited to, a peripheral control interface (PCI) bus, and Industry Standard Architecture (ISA) bus, and so forth. The bus system 74 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus 74. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A socket to mount and electrically connect an integrated circuit package to a circuit board, comprising:

a frame;

a plurality of electrical connectors mounted to the frame;

the plurality of electrical connectors including at least one pair of a power and a ground connector;

the power connector including a first broadside portion and the ground connector including a second broadside portion, the first and the second broadside portions being disposed in an adjacent, spaced-apart, and substantially parallel relationship;

the power and the ground connectors of the at least one pair including a first and a second mating contact, respectively, disposed to biasingly engage the integrated circuit package; and the power and the ground connectors of the at least one pair being disposed and configured to be mirror images of each other relative to a geometric plane bisecting a distance between the power and the ground connectors.

2. The socket according to claim 1, wherein the power connector further includes a first arcuate arm portion extending outwardly in a first direction from a first center of one end of the first broadside portion and a first soldering contact mounted on the end of the first arcuate arm and wherein the ground connector further includes a second arcuate arm extending outwardly in a second direction from a second center of one end of the second broadside portion and a second soldering contact mounted on the end of the second arcuate arm, the first and the second directions being substantially opposite to each other and substantially perpendicular to the geometric plane.

3. The socket according to claim 2, wherein the power connector further includes a first bracket portion extending outwardly in the first direction from a first side of the first broadside portion and the first mating contact mounted on the end of the first bracket portion and wherein the ground connector further includes a second bracket portion extending outwardly in the second direction from a second side of the second broadside portion and the second mating contact mounted on the end of the second bracket portion, the first side and the second side being adjacent to each other.

4. An electronic assembly, comprising:
an integrated circuit (IC) package having a first planar surface with a plurality of land pads;
a circuit board having a second planar surface with a plurality of electrical contacts, the second planar surface being disposed in a substantially parallel, spaced-apart relationship with the first planar surface;
a land-grid-array (LGA) socket disposed between the first and the second planar surfaces, the LGA socket including a frame and a plurality of connectors mounted to the frame to electrically couple the land pads of the IC package to the electrical contacts of the circuit board;
the plurality of connectors including at least one pair of a power and a ground connector, with the power and the ground connectors of the pair being disposed and configured to be mirror images of each other relative to a geometric plane substantially bisecting a distance between the power and the ground connectors, the geometric plane being substantially perpendicular to the first and the second planar surfaces; and
the power and the ground connectors of the at least one pair including a first and a second mating contact, respectively, disposed in biasing engagement with the land pads of the IC package.

5. The electronic assembly according to claim 4, wherein the power and the ground connectors each include a broadside portion disposed to face each other in an adjacent, spaced-apart and substantially parallel relationship.

6. The electronic assembly according to claim 4, wherein the power connector includes a first broadside portion and the ground connector includes a second broadside portion, the first and the second broadside portions being disposed in an adjacent, spaced-apart, and substantially parallel relationship.

7. The electronic assembly according to claim 6, wherein the power connector further includes a first arcuate arm extending outwardly in a first direction from a first center of one end of the first broadside portion and a first soldering contact mounted on the end of the first arcuate arm and wherein the ground connector further includes a second arcuate arm extending outwardly in a second direction from a second center of one end of the second broadside portion and a second soldering contact mounted on the end of the second arcuate arm, the first and the second directions being substantially opposite to each other and substantially perpendicular to the geometric plane.

8. The electronic assembly according to claim 7, wherein the power connector further includes a first bracket portion extending outwardly in the first direction from a first side of the first broadside portion and the first mating contact mounted on the end of the first bracket portion and wherein the ground connector further includes a second bracket portion extending outwardly in the second direction from a second side of the second broadside portion and the second mating contact mounted on the end of the second bracket portion, the first side and the second side being adjacent to each other.

9. A system, comprising:
an electronic assembly including an integrated circuit (IC) package having a first planar surface with a plurality of land pads; a circuit board having a second planar surface with a plurality of electrical contacts, the second planar surface being disposed in a spaced-apart substantially parallel relationship with the first planar surface; a land-grid-array (LGA) socket disposed between the first and the second planar surfaces; the LGA socket including a frame and a plurality of connectors mounted to the frame to electrically couple the land pads of the IC package to the electrical contacts of the circuit board; the plurality of connectors including at least one pair of a power and a ground connector; the power and the ground connectors of the pair being disposed and configured to be mirror images of each other relative to a geometric plane substantially bisecting a distance between the power and the ground connectors, the geometric plane being substantially perpendicular to the first and the second planar surfaces; and the power and the ground connectors of the at least one pair including a first and a second mating contact, respectively, disposed in biasing engagement with the land pads of the IC package;
a dynamic random access memory coupled to the electronic assembly; and an input/output interface coupled to the electronic assembly.

10. The system according to claim 9, wherein the IC package includes a microprocessor and the circuit board is a motherboard.

11. The system according to claim 9, wherein the input/output interface comprises a networking interface.

12. The system according to claim 10, wherein the system is a selected one of a set-top box, an entertainment unit and a DVD player.

13. The system according to claim 9, wherein the power connector includes a first broadside portion and the ground connector includes a second broadside portion, the first and the second broadside portions being disposed in an adjacent, spaced-apart, and substantially parallel relationship.

14. The system according to claim 13, wherein the power connector further includes a first arcuate arm extending outwardly in a first direction from a first center of one end of the first broadside portion and a first soldering contact mounted on the end of the first arcuate arm and wherein the ground connector further includes a second arcuate arm extending outwardly in a second direction from a second center of one end of the second broadside portion and a second soldering contact mounted on the end of the second arcuate arm, the first and the second directions being substantially opposite to each other and substantially perpendicular to the geometric plane.

15. The system according to claim 14, wherein the power connector further includes a first bracket portion extending outwardly in the first direction from a first side of the first broadside portion and the first mating contact mounted on the end of the first bracket portion and wherein the ground connector further includes a second bracket portion extending outwardly in the second direction from a second side of the second broadside portion and the second mating contact mounted on the end of the second bracket portion, the first side and the second side being adjacent to each other.

* * * * *

UNITED STATES PATENT AND TRADEMARK OFFICE
CERTIFICATE OF CORRECTION

PATENT NO. : 6,877,998 B1  Page 1 of 1
APPLICATION NO. : 10/728463
DATED : April 12, 2005
INVENTOR(S) : Kim et al.

It is certified that error appears in the above-identified patent and that said Letters Patent is hereby corrected as shown below:

Col. 5, line 36, "respective,..." should read -- respectively,...--.

Signed and Sealed this

First Day of August, 2006

JON W. DUDAS
*Director of the United States Patent and Trademark Office*